United States Patent
Riley et al.

(10) Patent No.: US 8,362,828 B2
(45) Date of Patent: Jan. 29, 2013

(54) SAMPLING FILTER USING MULTIPLE CLOCKS

(75) Inventors: Tom Riley, Osgoode (CA); Qinghong Du, Kanata (CA); Sami Karvonen, Oulu (FI)

(73) Assignee: Kaben Wireless Silicon Inc., Ottawa, Ontario (CA)

( * ) Notice: Subject to any disclaimer, the term of this patent is extended or adjusted under 35 U.S.C. 154(b) by 164 days.

(21) Appl. No.: 12/742,670

(22) PCT Filed: Nov. 14, 2008

(86) PCT No.: PCT/CA2008/002004
§ 371 (c)(1),
(2), (4) Date: Aug. 24, 2010

(87) PCT Pub. No.: WO2009/062306
PCT Pub. Date: May 22, 2009

(65) Prior Publication Data
US 2011/0043256 A1    Feb. 24, 2011

Related U.S. Application Data

(60) Provisional application No. 60/996,408, filed on Nov. 15, 2007.

(51) Int. Cl.
H03K 5/00    (2006.01)

(52) U.S. Cl. .......................................... 327/553; 327/337

(58) Field of Classification Search .......... 327/336–337, 327/551–559
See application file for complete search history.

(56) References Cited

U.S. PATENT DOCUMENTS

| | | | |
|---|---|---|---|
| 4,333,064 A | 6/1982 | Kato et al. | |
| 4,653,017 A | 3/1987 | Colbeck et al. | |
| 4,731,602 A | 3/1988 | Hata | |
| 4,924,189 A | 5/1990 | Senn et al. | |
| 6,181,740 B1 * | 1/2001 | Yasuda | 375/232 |
| 6,771,711 B2 * | 8/2004 | Kranz et al. | 375/305 |
| 6,829,311 B1 | 12/2004 | Riley | |

(Continued)

FOREIGN PATENT DOCUMENTS

| | | |
|---|---|---|
| DE | 3044724 | 6/1982 |
| EP | 0307276 A1 | 3/1989 |

(Continued)

OTHER PUBLICATIONS

International Searching Authority, "International Search Report", for international application No. PCT/CA2008/002004, applicant Kaben Wireless Silicon Inc. et al.

(Continued)

*Primary Examiner* — Dinh T. Le
(74) *Attorney, Agent, or Firm* — Brion Raffoul

(57) ABSTRACT

Methods and devices for forming a series of samples of a filtered version of an input signal. Multiple tap current cells each generate a tap current from the signal. Multiple distribution means couple the tap current cells with multiple integrating means. The distribution means is controlled by a first clock signal. The multiple integrating means integrate tap currents that they receive and these integrating means form the samples. The tap currents generated are each sent to each integrating means in a predetermined sequence according to the first clock signal. The integrating means each use integrating and sampling phases controlled by a second clock signal. During the integrating phase an integrating means receives tap currents in sequence, while during the rest phase, no tap currents are received and the contents of the circuit are sampled and the integrator means is reset.

19 Claims, 12 Drawing Sheets

U.S. PATENT DOCUMENTS

| | | | |
|---|---|---|---|
| 7,539,721 B2 * | 5/2009 | Belveze et al. | 708/819 |
| 7,979,047 B2 * | 7/2011 | Miyano et al. | 455/334 |
| 8,111,741 B2 * | 2/2012 | Miyano et al. | 375/229 |

FOREIGN PATENT DOCUMENTS

| | | |
|---|---|---|
| JP | 11008531 | 1/1999 |
| WO | 2007049199 A1 | 5/2007 |

OTHER PUBLICATIONS

International Searching Authority, "Written Opinion of the International Searching Authority", for international application No. PCT/CA2008/002004, applicant Kaben Wireless Silicon Inc. et al.

* cited by examiner

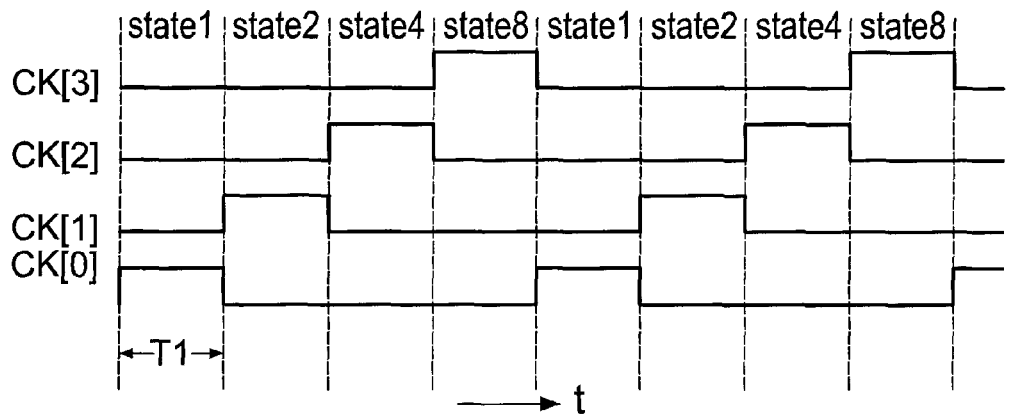
FIG. 2
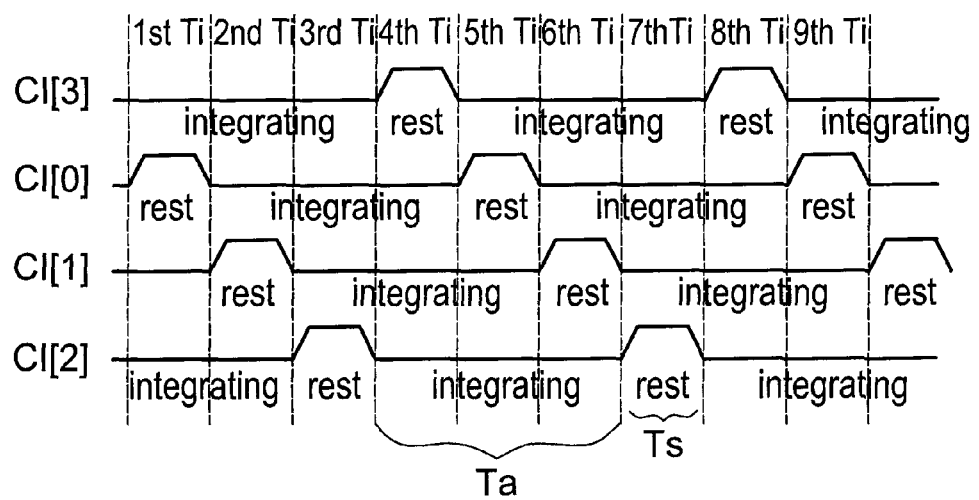
FIG. 3
FIG. 4

| CK1[2:0] | CK2[2:0] | CK3[2:0] | CK4[2:0] | CK5[2:0] |
|----------|----------|----------|----------|----------|
| 1 0 0 | 0 0 1 | 0 0 1 | 0 0 1 | 0 1 0 |
| 1 0 0 | 1 0 0 | 0 0 1 | 0 0 1 | 0 0 1 |
| 1 0 0 | 1 0 0 | 1 0 0 | 0 0 1 | 0 0 1 |
| 0 1 0 | 1 0 0 | 1 0 0 | 1 0 0 | 0 0 1 |
| 0 1 0 | 0 1 0 | 1 0 0 | 1 0 0 | 1 0 0 |
| 0 1 0 | 0 1 0 | 0 1 0 | 1 0 0 | 1 0 0 |
| 0 0 1 | 0 1 0 | 0 1 0 | 0 1 0 | 1 0 0 |
| 0 0 1 | 0 0 1 | 0 1 0 | 0 1 0 | 0 1 0 |
| 0 0 1 | 0 0 1 | 0 0 1 | 0 1 0 | 0 1 0 |

FIG. 9

| CK1[3:0] | CK2[3:0] | CK3[3:0] | CK4[3:0] | CK5[3:0] |
|----------|----------|----------|----------|----------|
| 0 1 0 0 | 0 0 0 1 | 0 0 0 1 | 0 0 0 1 | 0 0 1 0 |
| 0 1 0 0 | 1 0 0 0 | 0 0 0 1 | 0 0 0 1 | 1 0 0 0 |
| 0 1 0 0 | 0 1 0 0 | 1 0 0 0 | 0 0 0 1 | 0 0 0 1 |
| 1 0 0 0 | 0 1 0 0 | 0 1 0 0 | 1 0 0 0 | 0 0 0 1 |
| 0 0 1 0 | 0 1 0 0 | 0 1 0 0 | 0 1 0 0 | 0 0 0 1 |
| 0 0 1 0 | 1 0 0 0 | 0 1 0 0 | 0 1 0 0 | 1 0 0 0 |
| 0 0 1 0 | 0 0 1 0 | 1 0 0 0 | 0 1 0 0 | 1 0 0 0 |
| 1 0 0 0 | 0 0 1 0 | 0 0 1 0 | 1 0 0 0 | 1 0 0 0 |
| 0 0 0 1 | 0 0 1 0 | 0 0 1 0 | 0 0 1 0 | 1 0 0 0 |
| 0 0 0 1 | 1 0 0 0 | 0 0 1 0 | 0 0 1 0 | 1 0 0 0 |
| 0 0 0 1 | 0 0 0 1 | 1 0 0 0 | 0 0 1 0 | 0 0 1 0 |
| 1 0 0 0 | 0 0 0 1 | 0 0 0 1 | 1 0 0 0 | 0 0 1 0 |

FIG. 10

SAMPLING FILTER USING MULTIPLE CLOCKS

CROSS REFERENCE TO RELATED APPLICATIONS

This application is a National Phase entry of International Patent Application Serial No. PCT/CA2008/002004 filed 14 Nov. 2008, and claims the benefit of priority of U.S. Provisional Patent Application No. 60/996,408 filed 15 Nov. 2007, which are hereby incorporated by reference.

TECHNICAL FIELD

The present invention relates generally to signal processing. More specifically, the present invention relates to methods and devices for filtering a signal by using multiple tap currents generated from the signal and integrating the tap currents to form a series of samples of a filtered version of the input.

BACKGROUND OF THE INVENTION

In communication systems designs, analog filters are usually required for image removal/rejection or anti-aliasing. Analog filters are the family of filters that are capable of taking analog signals and outputting analog, continuous-time or discrete-time signals. It is desirable to have analog filters integrated onto an integrated circuit to reduce the overall cost and the size of the system. Two types of filter are commonly used in integrated circuit applications: the switched capacitor (SC) filter and the transconductance-capacitor (gm-C) filter. The SC filters have very precisely defined filtering characteristics because the time constants associated with the frequency response depend only on the capacitor ratios and the clock frequency. SC filters are known to have a number of drawbacks. First, when used at a typical intermediate frequency (IF) in a radio system, it is capable of causing aliasing of interfering signals. Secondly, it has a noise problem which can only be mitigated at the price of increased power consumption. On the other hand, gm-C filters typically provide lower noise and consume less power than SC filters but suffer in the area where SC filters perform well. Since the time constant in a gm-C filter are determined by gm and C, the frequency response is sensitive to process variations, temperature drift and power supply variations. Calibration loops are required to cancel out these effects but complicates the designs significantly. For these reasons, it is difficult to construct very high-order high-precision gm-C type of filters. Both of these filter types have difficulties producing area-efficient FIR filters.

Recently, another type of analog filter has been attempted. It involves generating one current or multiple currents from an input voltage signal, selectively integrating the current(s) to a pair of capacitors (as for example in U.S. Pat. No. 6,829,311) or multiple capacitors for a predetermined time interval, and then sampling the charges accumulated on the capacitors and then resetting for the next current integrating cycle. The selective current integration operation realizes a finite impulse response (FIR) filter. In one reference, multiple currents are generated to be selectively integrated on a capacitor. The currents are generated in such a way that the currents are proportional to the input signal and the tap coefficients of a desired FIR filter. The current generation is realized by having multiple transconductance amplifiers with gains corresponding to the tap coefficients. Since transconductance of the amplifiers are dependent upon process variations, temperature drifts and power supply variations, the resultant filter frequency response is sensitive to these variations as in the case of the conventional analog filters. In U.S. Pat. No. 6,829,311, a single current converted from the input voltage signal is sent to a pair of capacitors. The FIR filter taught by this reference substantially reduces the above sensitivity problem as its frequency response depends only on the clock frequency and matching accuracy of the current integration capacitors. However, it is limited to filters with tap coefficients comprising 0's and 1's which prevent it from realizing arbitrary FIR filters. The limitation can be worked around by quantizing an arbitrary set of tap coefficients using a delta sigma technique. Since there are only two quantization levels, 0 or 1, the resulting quantization error in the filter frequency response can be very high which requires additional filtering to reduce it to acceptable levels.

It should also be noted that sampling filters in the prior art have shortcomings that reduce their effectiveness when applied to real-world applications. Prior art sampling filters do not disclose filters with an impulse response longer than the period of the output sampling frequency. This does not allow for high sampling frequencies for narrow band filters that require long impulse responses.

Another drawback of present sampling filters is that they require extra filtering to remove quantization error in the tap coefficients when the tap coefficients are Delta-Sigma quantized. They are also excessively sensitive to analog mismatches in the tap currents.

Finally, in a sampling filter, the tap current at any given current integrating circuit increases from zero to the final value for every given predetermined interval. However, this introduces distortions to the filter transfer function or noise because of the tap current switching transients.

A need therefore exists for an analog filter with well controlled frequency response but with minimum quantization error in the transfer function. Furthermore, there is a need for methods and devices that avoid or mitigate the shortcomings of the prior art.

SUMMARY OF INVENTION

The present invention provides methods and devices for forming a series of samples of a filtered version of an input signal. Multiple tap current cells each generate a tap current from the signal. Multiple integrating means (or integrators) integrate tap currents that they receive and these integrating means (or integrators) form the samples. The tap currents generated are each sent to each integrating means in a predetermined sequence. The integrators each use integrating and sampling phases. During the integrating phase, a integrating means receives tap currents in sequence, while during the rest phase, no tap currents are received and the contents of the circuit are sampled and the integrator means is reset.

In a first aspect, the present invention provides a filter for filtering and sampling an input signal, the filter comprising:
a plurality of tap current cells each tap current cell being for producing at least one tap current from said input signal;
a plurality of current integrating cells each current integrating cell being for receiving and integrating a tap current;
sampling means for making a sample of the contents of said current integrating cells;
current distribution means for coupling said tap current cells with said current integrating cells;
Wherein
said current distribution means is controlled by at least one first clock signal and said sampling means is controlled by at least one second clock signal.

In a second aspect, the present invention provides a method for filtering a signal, the method being for use with a device having a plurality of integrating means, the method comprising:

a) receiving said signal;

b) generating a plurality of tap currents based on said signal;

c) sending each of said plurality of tap currents to a specific one of said plurality of integrating means in a predetermined sequence during an integrating phase for said specific one of said plurality of integrating means;

d) sampling said specific one of said plurality of integrating means during a sampling phase for said specific one of said plurality of integrating means;

e) repeating steps c) and d) for each of said plurality of integrating means wherein said sampling phase is a phase when none of said tap currents are being sent to said specific one of said plurality of integrating means.

In a third aspect, the present invention provides a filter for filtering and sampling an input signal, the filter comprising:

a plurality of tap current cells each tap current cell being for producing at least one tap current from said input signal;

a plurality of current integrating cells each current integrating cell being for receiving and integrating a tap current;

sampling means for sampling contents of said current integrating cells;

current distribution means for coupling said tap current cells with said current integrating cells wherein said current distribution means is controlled by at least one first clock signal and said sampling means is controlled by at least one second clock signal and at least one integrating means receives multiple tap currents simultaneously.

In a fourth aspect, the present invention provides a method for filtering a signal, the method being for use with a device having a plurality of integrating means, the method comprising:

a) receiving said signal;

b) generating a plurality of tap currents based on said signal;

c) sending each of said plurality of tap currents to a specific one of said plurality of integrating means in a predetermined sequence during an integrating phase for said specific one of said plurality of integrating means;

d) sampling a charge in said specific one of said plurality of integrating means during a sampling phase for said specific one of said plurality of integrating means;

e) repeating steps c) and d) for each of said plurality of integrating means wherein said sampling phase is a phase when none of said tap currents are being sent to said specific one of said plurality of integrating means and during said integrating phase, multiple tap currents are simultaneously being sent to said specific integrating means.

BRIEF DESCRIPTION OF THE DRAWINGS

A better understanding of the invention will be obtained by considering the detailed description below, with reference to the following drawings in which:

FIG. 2 is a timing diagram for a state change for 3 clock buses which may be used with the embodiment in FIG. 1

FIG. 3 illustrates the rotation of the three clock bus states for the timing diagram in FIG. 2.

FIG. 4 is a timing diagram of the integrating and rest phases for the four tap currents in the embodiment of FIG. 1.

FIG. 9 shows the rotation of the clock bus states used to implement the rotation of the tap currents for the embodiment in FIG. 7.

FIG. 10 shows the rotation of the clock bus states used to implement a variant of the embodiment in FIG. 7.

DETAILED DESCRIPTION OF THE INVENTION

The present invention can be implemented in different embodiments. The following different embodiments are examples of specific embodiments which implement the invention. A generalized sampling filter embodying the principle of the invention will be presented after the different embodiments have been discussed.

One advantage of the invention is that it provides filters whose impulse response is longer that the sampling period. Circuits and methods to obtain this advantage are now described.

Figure 1:
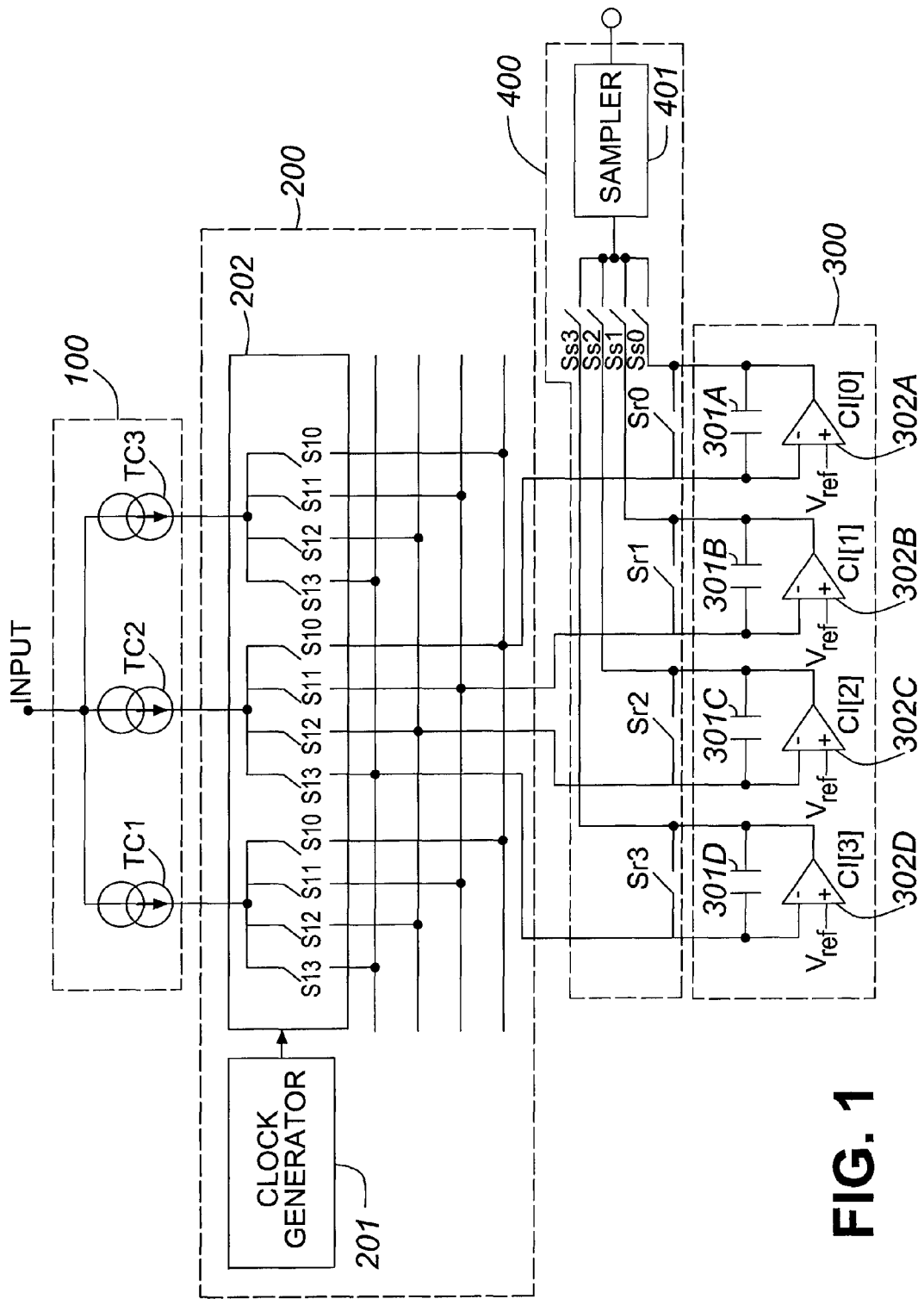
FIG. 1 is a schematic illustration of a first embodiment of the invention that uses rotating tap currents.

Referring to FIG. 1, the sampling filter comprises a current splitting means (current splitters) or current replicating means (current replicators) 100 that generates three tap currents where each tap current is proportional to an input signal with some predetermined proportionality constant, TC1, TC2, and TC3, an array of integrating means (integrators) 300 that consists of four integrating means CI[3], CI[2], CI[1] and CI[0], a current distribution means (current distributor) is provided by a current rotating means (current rotators) 200 for sending the three tap currents to the four integrating means, and a sampling and resetting means (sampler and resetters) 400. In embodiments of this aspect of the invention, the tap currents correspond to a final set of tap coefficients.

These tap currents are applied in a sequence corresponding to a desired filter response the filter transfer function being given by, $$H_{FIR}(z) = \sum_{k=0}^{N_t-1} h_k - z^{-k}$$

where $z=e^{j2\pi fTi}$ and $h_k$ for $k=0, 1, 2, \ldots, N_t-1$ are the final set of tap coefficients.

FIG. 1 can be used to illustrate a filter where Nt=3 for a filter with three tap currents and four integrating means. In this case a three tap FIR filter can be implemented with three tap currents with TC1 TC2 and TC3 corresponding to $h_2$, $h_1$, and $h_0$ respectively.

Each integrating means comprises an operational amplifier 302A, 302B, 302C, 302D and a capacitor 301A, 301B, 301C, 301D which is coupled between the negative input and the output of the operational amplifier. The positive inputs of the operational amplifiers are set to a constant reference voltage Vref. The current rotating means consists of a switch matrix 202 which is an array of switches coupled between any of the three tap currents TC1, TC2, TC3 and any of the four integrating means CI[3], CI[2], CI[1] and CI[0], and a clock generator 201. As an example, switches S13, S12, S11, and S10 connect the first tap current, TC1, to integrating means CI[3], CI[2], CI[1] and CI[0], respectively. These switches are controlled by 12 clock signals (not shown in the FIG. 1) generated by the clock generator 201. Sampling and resetting means 400 comprises four switches Ss0, Ss1, Ss2 and Ss3 and a sampler 401. Each integrating means periodically goes though two operating phases: an integrating phase, when there is at least one current that is being received by the integrating means, and a rest phase when no tap current is received. During the rest phase, its charge is sampled by observing the voltage at the output of the operational amplifier with sampler 401 by closing the corresponding sample selecting switch coupled between the operational amplifier output and the sampler. The signal on the integrating circuit is then reset by closing the reset switch coupled between the two terminals of the corresponding capacitor.

Although this embodiment has been described in terms of sampling the voltage at the output of the operational amplifier, the charge can also be sampled by transferring it to the output of another operational amplifier in the sampler using well known switched capacitor techniques.

Clock generator 201 provides 3 clock buses CK1[3:0], CK2[3:0] and CK3[3:0] (not shown in FIG. 1) for controlling the 12 switches coupled between the tap currents and the integrating means, respectively. Specifically, CK1[3], CK1[2], CK1[1] and CK1[0] control S13, S12, S11, and S10, respectively. Similarly, CK2[3], CK2[2], CK2[1], CK2[0], CK3[3], CK3[2], CK3[1] and CK3[0] control S23, S22, S21, S20, S33, S32, S31, and S30, respectively. A switch is closed when its corresponding clock bus bit is high and open otherwise. A tap current can only be sent to one integrating means at a time except during the current switching transient when a current can be momentarily sent to two integrating means. This means that for any of the clock buses at any time there is only one bit that is high. It is convenient to describe the state of a clock bus in terms of a digital word. For example, digital word [1000] denotes that clock bus state where the MSB of the clock bus, e.g., CK1[3], is high and the other three bits of clock buses are low. As another example, [0010] describes a state where the second LSB of the clock bus, e.g., CK1[1], is high and the rest are low. It follows that for all the clock buses there are only four possible states: state 4 or [1000], state 3 or [0100], state 2 or [0010], and state 1 or [0001]. The minimum time interval that a clock bus stays at one state is denoted by Ti. A clock bus can stay at one state, e.g., [1000], for one Ti or multiples of Ti. The tap current switching can now be described in terms of clock bus state changes or rotation. For example, CK1[3:0] staying at [1000] for 2 Ti intervals and then changed to [0100] describes that tap current TC1 is sent to integrating means CI[3] for 2 Ti intervals and the switched to CI [2].

In this embodiment, a tap current is sent to a integrating means for one Ti interval. Each of the three clock buses change state every Ti interval and periodically goes through the four possible states in the same order as follows: [0001]→[0010]→[0100]→[1000]→[0001]→ . . . . FIG. 2 shows the timing diagram of such a state change for one of the 3 clock buses. At each Ti cycle, the state of the four clocks is one of the four possible states and the clock state changes every Ti. In FIG. 2, the states are denoted as state 1 [0001], state 2 [0010], state 4 [0100], and state 8 [1000].

FIG. 3 shows another way of looking at the clock buses illustrated in FIG. 2. In FIG. 3, each time interval Ti corresponds to one line in the figure. It can be seen that there is a state rotation every Ti where the active bit is shifted to the left by one column. The difference in the state rotation among the three clock buses is that they start with different initial states and remain out of phase by a fixed amount. For example, on the very first Ti cycle, CK1[3:0]=[1000], CK2=[0100], and CK3=[0010]. Referring to FIG. 3 in conjunction with FIG. 1, on the first Ti cycle, i.e., during the first Ti interval, tap current TC1 is sent to integrating means CI[3]. On the second, third, and fourth Ti cycle, TC1 is switched to CI[0], CI[1], CI[2], respectively. That is, every time the tap current is switched to a new integrating means, it is always the adjacent one. In this specific case, the next integrating means of CI[3] is CI[0] and the current "rotates" in the following direction: CI[0]→CI[1]→CI[2]→CI[3]→CI[0]→CI[1]→ . . . . Tap currents TC2 and TC3 also rotate in the same fashion except that they start from different initial destinations: TC2 is sent to CI[2] and TC3 to CI[1] on the first Ti cycle.

The result of the above current rotation is that for each integrating means all the tap currents are sent to the integrating circuit one at a time every Ti in a predetermined order of TC1 and then TC2 and finally TC3. For example, CI[3] receives tap currents TC1, TC2, and TC3 on the first, the second, and the third Ti cycles, respectively. On the fourth cycle, no current is sent to CI[3]. During this cycle, CI[3] is in a rest phase. Each integrating means in this embodiment periodically goes through an integrating phase of three Ti intervals in length and a rest phase of one Ti. Taking CI[0] as another example, it receives tap currents TC1, TC2, and TC3 on the second, the third and fourth Ti cycles, respectively. In this embodiment for every Ti interval, one integrating means (integrator) enters a rest phase, the charges on that integrating means is ready for sampling. FIG. 4 shows the timing diagram of the integrating and rest phases for the four integrating means where a rest phase is denoted by a pulse. As previously described, the voltage on the each of the capacitors in the four integrating means is sampled when the integrating circuit is in the rest phase. Starting from the 4th Ti, the sampling filter illustrated in FIG. 1 produces a valid sampled output signal every Ti. In this case, the sampling period Ts, i.e., the time interval between when two adjacent samples are taken, is equal to the FIR clock period Ti. Note that the samples produced on the 1st, the 2nd, and the 3rd Ti cycles, when CI[0], CI[1], and CI[2] are in the rest phase, respectively, are not valid ones as none of the three integrating means has integrated all the tap currents before entering the rest phase.

Design of clock generator 201 is well know to those skilled in the field of digital circuit design. In general, the clocks can be easily derived from a clock having a period of Ti.

Circuits and methods for generating clocks for the reset switches are also well known to those skilled in the art. The active phase of the clock should occur after the pulses for the sample selection switches. This ensures that the sampling operation happens before the signal disappears by reset or before the circuit is reset. It is advantageous for sampler 401 shown in FIG. 1 to be arranged to sample the signal at its input immediately before the falling edge of the clock signal for switching the sample selection switch. This gives more time for the charge integrating process to settle.

In this embodiment (illustrated in FIG. 1 and explained above), the number of tap currents, Nt, must be smaller than the number of the integrating means, Ns. The duration of the rest phase, Trest, will be NrTi=(Ns−Nt) Ti where Nr is the number of Ti intervals in the rest phase. Nr is usually determined in part by the time required for settling of any transient signals in the integrating capacitors and operational amplifiers. Nr can be made larger by increasing the number of integrating means. Nt is determined by the desired filter specification. Once Nr is determined, Ns is the sum of Nr and Nt.

In the above-described embodiment, the sampling period is equal to the FIR clock period Ti. The sampling period Ts within the scope of this invention does not have to be the same as Ti. If a larger sampling period is acceptable, some of the integrating means can be replaced with grounds or virtual grounds. For example, if a sampling period of 2 Ti intervals is acceptable, then integrating means CI[2] and CI[0] can be replaced with grounds or virtual grounds. With this embodiment employing fewer integrating means, switches Sr2, Sr0 for resetting CI[2] and CI[0] can be removed. Similarly, their corresponding sample selecting switches Ss2 and Ss0 can be removed as well. All other switches and their corresponding clock signals remain the same. With such a modification, each tap current, when disconnecting from its present integrating means is thrown away for an interval of Ti before being sent to the next integrating means. With this modified embodiment employing fewer integrating means, the three tap currents are received one at a time, every three consecutive Ti intervals by each of the remaining integrating means.

This modified embodiment can be generalized to include the cases where there is more than one ground or virtual ground between any two adjacent integrating means. The number of grounds or virtual grounds should be the same between any two adjacent integrating means throughout the system. This includes between the first integrating means and the last integrating means as these two are "adjacent" if one thinks of the integrating means or circuits as being in a ring configuration. The integrating means and the grounds or virtual grounds in between form an array of tap current destinations. For such a generalized embodiment, the switch matrices and the clocks controlling these switches will be the same as if the array of current destinations is made up of integrating means only. It should be noted that all the grounds or virtual grounds may be implemented in hardware as a single ground/virtual ground or as multiple different grounds/virtual grounds.

Figure 5:
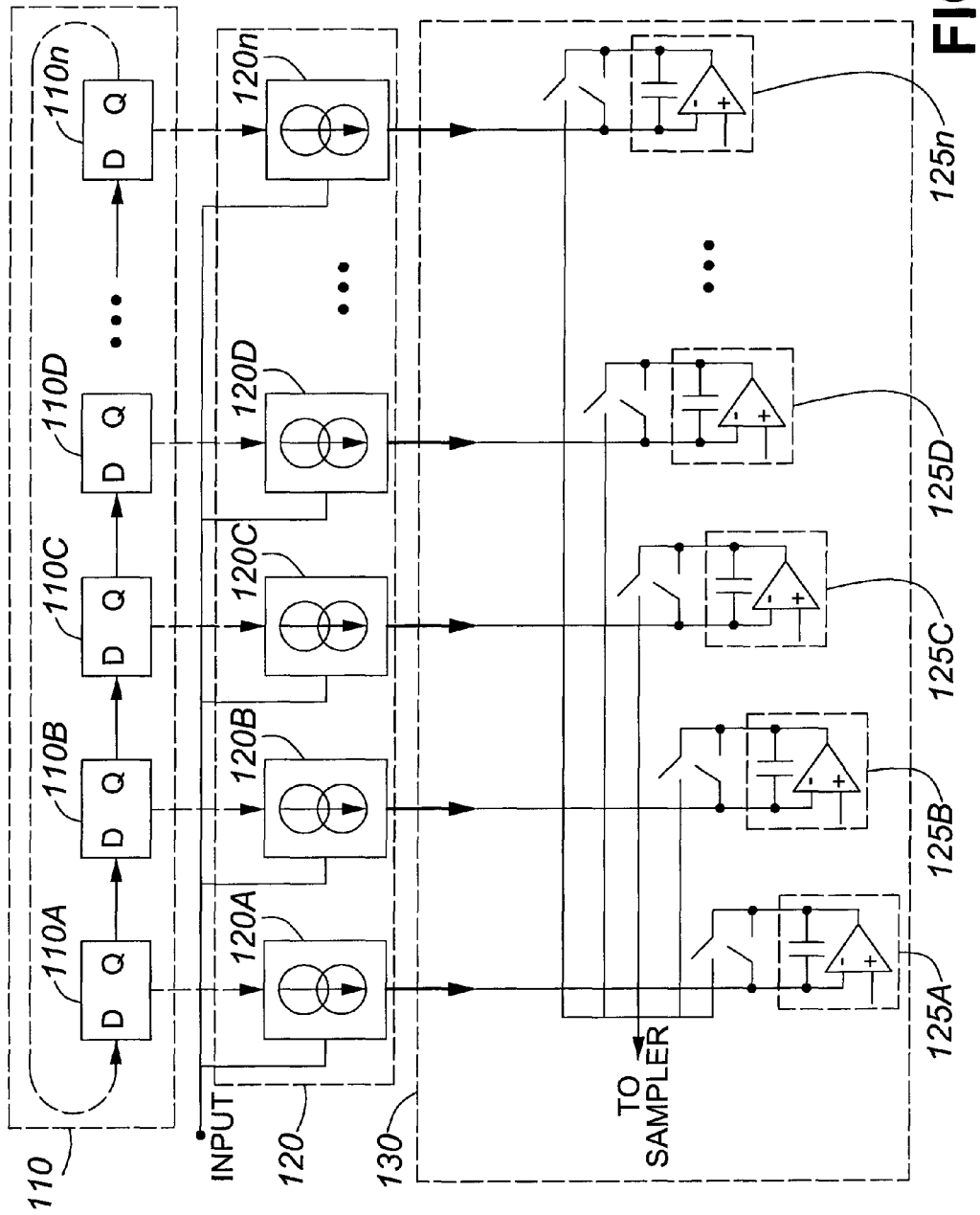
FIG. 5 is a schematic illustration of a second embodiment of the invention that uses rotating tap coefficients.

Another embodiment of the invention is illustrated in FIG. 5. In this embodiment, the tap current distribution means is provided by rotating filter tap coefficients. The sampling filter consists of a tap storage and rotating means 110, an array of programmable or configurable tap current cells 120, and an array of integrating means 125 together with a sampling and resetting means 130. As can be seen, the arrays 130 and 125 are the same as the arrays of integrating means 300 and resetting means Sr0 to Sr3 from FIG. 1. The sampling means Ss0 to Ss3 and sampler 401 from FIG. 1 are not shown in FIG. 5.

The tap storage and rotating means 110 comprise an array of filter tap coefficients storage elements 110A, 110B, 110C, 110D, 110E, ... 110n. The means 110 may be implemented as a shift register consisting of cascade-connected registers comprising D flip-flops with appropriate initial values set by a power on reset. The last element on the right-hand side is connected to the first element (on the left-hand side). The elements are therefore coupled in a ring configuration. In this embodiment, each tap coefficient storage element is coupled to a corresponding element of the array of the programmable tap current cells.

The tap current generated by each tap current cell is proportional to an input signal with a programmable proportionality constant set by the filter tap coefficient stored in the corresponding storage element. As the filter tap coefficient stored in the storage element changes, so does the tap current being generated by the tap current cell. The outputs of the array of the programmable tap current cells are coupled to the array of integrating means. Each tap current cell is coupled to one corresponding integrating means.

One way to make the tap current cells programmable is to use quantized filter tap coefficients and make each tap current cell comprise a number of identical unit tap current cells. Each unit tap current cell provides a current proportional to the input signal that can be enabled or disabled. For example, one tap current cell consists of 4 identical unit tap current cells. When the controlling tap coefficient is 1, only one unit is enabled.

The details of the embodiment may be better understood with the aid of the following example. If tap coefficient a is in storage element 110A, then tap current a1 is generated by tap current cell 120A and this is sent to integrating means 125A. When tap coefficient a is shifted to storage element 110B in the shift register, the tap current a1 is now generated by tap current cell 120B and is received by integrating means 125B. Of course, this assumes that tap current cell 120A is similar to tap current cell 120B.

The number of filter tap coefficients, Nt, should be less than the number of tap storage elements, Ntse. In FIG. 5, Ntse=n and Nt<n. This will allow for storage elements to store padding zeros, thereby causing the corresponding tap current cells to generate zero current. The integrating means in the embodiment of FIG. 5 also undergo integrating and rest or sampling phases. When a integrating means receives non-zero tap currents, it is in its integrating phase. When an integrating means receives a zero tap current, it is in its sampling phase. A sampling phase is the phase when the charge in a integrating means is sampled and reset.

The number of Ti intervals during which padding zeros slide through a tap storage element is equal to Ntse−Nt. As noted above, an integrating means connected to such tap a storage element receives no current and is therefore is in the rest or sampling phase. Thus, the number of Ti intervals in the rest phase is Nrest=Ntse−Nt. The required value for Nrest depends on how long the sampling phase is required and how long a Ti interval is. For example, if a Ti interval is equal to 2 ns while the sampling and resetting means requires 16 ns to sample and reset an integrating means, then 8 Ti intervals are required for the rest or sampling phase. For this example, Nrest=8. In this case, 8 tap storage elements must store padding zeros, i.e., the minimum number of tap storage elements in the shift register is Nt+8.

The padding zeros occupy contiguous storage elements. There are cases where the padding zeros may occupy the two "ends" of the array of the storage elements. For the above example requiring 8 padding zeros, 3 of the padding zeros may fill the last three storage elements (on the right hand side) while the rest occupy the first 5 storage elements. Because the storage elements are in a ring configuration, this case, and others like them, are still considered as "occupying contiguous storage elements" since the filter tap coefficient coming out of the last storage element (on the right hand side) will be shifted into the first storage element (on the left hand side). When a clock with a period of a Ti interval is applied to the clock input of the registers forming the shift register, the filter tap coefficients will rotate inside the shift register with the filter tap coefficients shifting on every clock pulse. Since the period of the clock is Ti, each tap coefficient or padding zero is stored in one storage element for one Ti. As a result, the proportionality factor (coefficient) of each tap current cell changes every Ti interval.

For this embodiment, the sampling period, Ts, is equal to one Ti interval. The sampling period is the time between one integrating means entering the rest phase and when the adjacent integrating means enters the rest phase.

Figure 6:
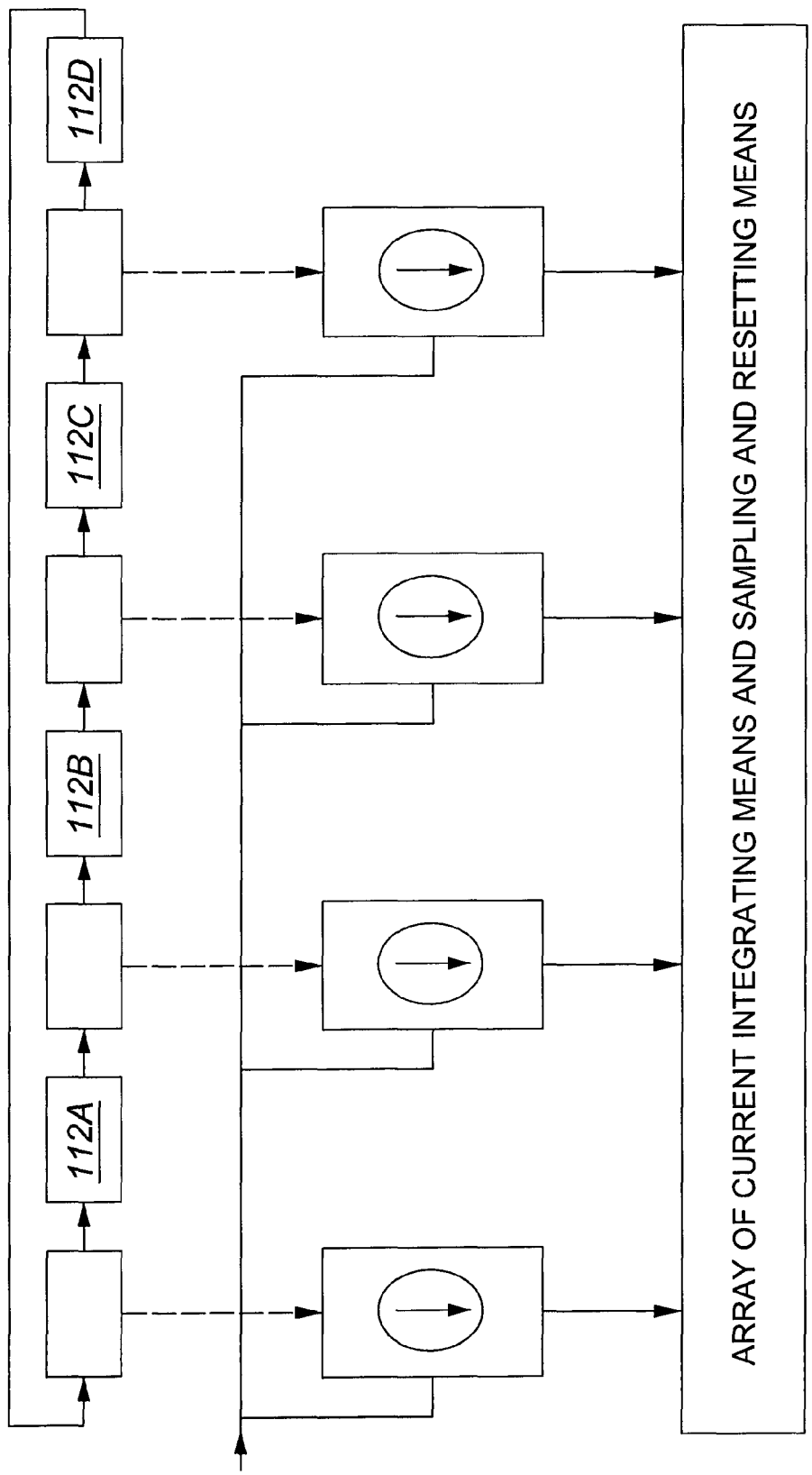
FIG. 6 is a schematic illustration of a variant of a second embodiment of the invention using rotating tap coefficients.

For some applications, a sampling period larger than a single Ti interval is acceptable. For such applications, a fixed number of padding registers, Npr, may be connected between every two adjacent registers that have tap current cells connected to them, as shown in FIG. 6. There are Npr padding registers between the last register having a tap current cell connected to it and the first register having a tap current cell attached. None of these padding registers 112A, 112B, 112C, 112D is connected a tap current cell. For FIG. 6, Npr=1. By using this configuration, one reduces the number of tap current cells and the number of the integrating means as opposed to having one tap current cell and one integrating means per storage element. For applications where Nt (the number of filter tap coefficients) is large, this will save significant silicon area.

If padding registers are used, the total number of registers in the shift register is given by M(Npr+1) with M being an integer. Thus, the number of storage elements is a multiple of (Npr+1). This constraint on the total number of storage elements is to be kept in mind along with the other constraint that the number of storage elements is greater than the number of filter tap coefficients (Nt). Specifically, M(Npr+1)=Nt+Nrest.

Calculating the required value for M starts by calculating Nrest, the number of Ti intervals in the rest phase. As with the case where every storage element has a current generating means, Nrest can be calculated in a similar manner. Npr can be calculated from the required sampling period, Ts, since, in this case, Ts=(Npr+1)Ti. M can be found by using the equation M(Npr+1)=Nt+Nrest. In the event the resulting value for M is not an integer, the result can be rounded up to the nearest integer. As an example, if Ti=2 ns, and the required sampling period Ts=10 ns, then Npr=4, i.e., there are 4 padding storage elements between any two adjacent storage elements that have tap current cells connected to them.

For this example, the total number of storage elements is a multiple of 5. Thus, if it is supposed that there are 100 filter tap coefficients and a rest phase of 8 Ti intervals are needed at a minimum, then M is equal to the integer close to but greater than (100+8)/5, i.e., M=22. Therefore Nrest=2 Ti. This example also shows that Nrest may be greater than what the circuit absolutely requires to satisfy the equation M(Npr+1)=Nt+Nrest. Also, to continue the example, there are 110 storage elements and the sampling period is 10 ns. The number of integrating means is 22 and there are 22 tap current cells. If no "padding storage elements" are used, 108 integrating means would have been required for a sampling period of 2 ns. Silicon area is reduced due to fewer integrating means if the increase in the sampling period is acceptable.

According to another aspect of the invention, the total current received by a integrating means (received tap current) may be the sum of two or more tap currents applied to it simultaneously. This can be used to obtain a filter where the final set of tap coefficients are a convolution of an intermediate set of tap coefficients with a secondary set of tap coefficients. In embodiments of this aspect of the invention, the tap currents correspond to the intermediate set of tap coefficients. The secondary set of tap coefficients are determined by the way in which the tap currents are applied to the integrating means.

Figure 7:
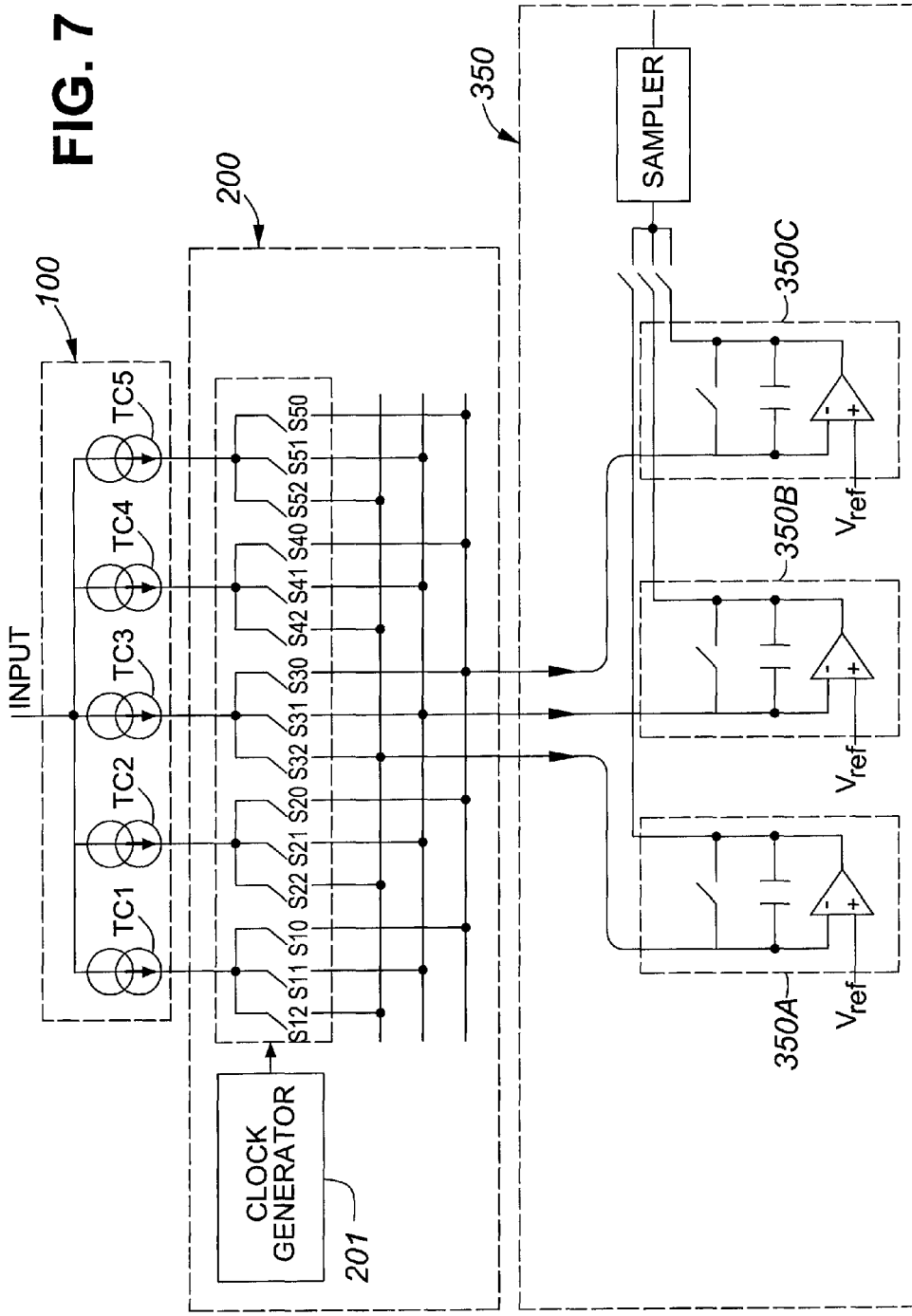
FIG. 7 is a schematic illustration of another embodiment of the invention where tap currents are convolved with a secondary set of tap coefficients by rotating the tap currents in a predetermined sequence.

An embodiment of this aspect of the invention shown in FIG. 7, comprises current splitting means or current replicating means 100, that generates 5 tap currents where each tap current is proportional to an input signal with some predetermined proportionality factor, an array of integrating means and sampling and resetting means 350, and a tap current distribution means 200. The array of tap current cells 100 provides tap currents TC[1], TC[2], . . . , TC[Nt] where Nt=5. The predetermined proportionality factor corresponds to the intermediate set of tap coefficients.

As in FIG. 1, current distribution means 200 comprises a switch matrix and a clock generator which returns to its initial state after each rotation cycle. The sampling and resetting means 350 is similar in structure to the resetting means 400 and the current integrating array 300 in FIG. 1. One difference between the two is that in FIG. 1, no two tap currents are sent to the same integrating means concurrently. The embodiment of FIG. 7 provides a filter with a final set of tap coefficients that are a convolution of an intermediate set of tap coefficients and a secondary set of tap coefficients.

In this embodiment, a received tap current is integrated in each integrating means. By receiving more than one tap current at a time, the proportionality constant of the received tap current can be a sum of zero or more proportionality factors that changes every Ti cycle. For example, with the embodiment of FIG. 7, the received tap current at integrating means 350A for each Ti cycle is:

RTC[1]=TC1;
RTC[2]=TC1+TC2;
RTC[3]=TC1+TC2+TC3;
RTC[4]=TC2+TC3+TC4;
RTC[5]=TC3+TC4+TC5;
RTC[6]=TC4+TC5;
RTC[7]=TC5;
RTC[8]=0;
RTC[9]=0;

This changing sum of proportionality factors corresponds to the final set of tap coefficients for the filter. In this example, the number of elements in the secondary set of tap coefficients Nconv is 3. The values of the secondary set of tap coefficients are [1 1 1].

Figure 8:
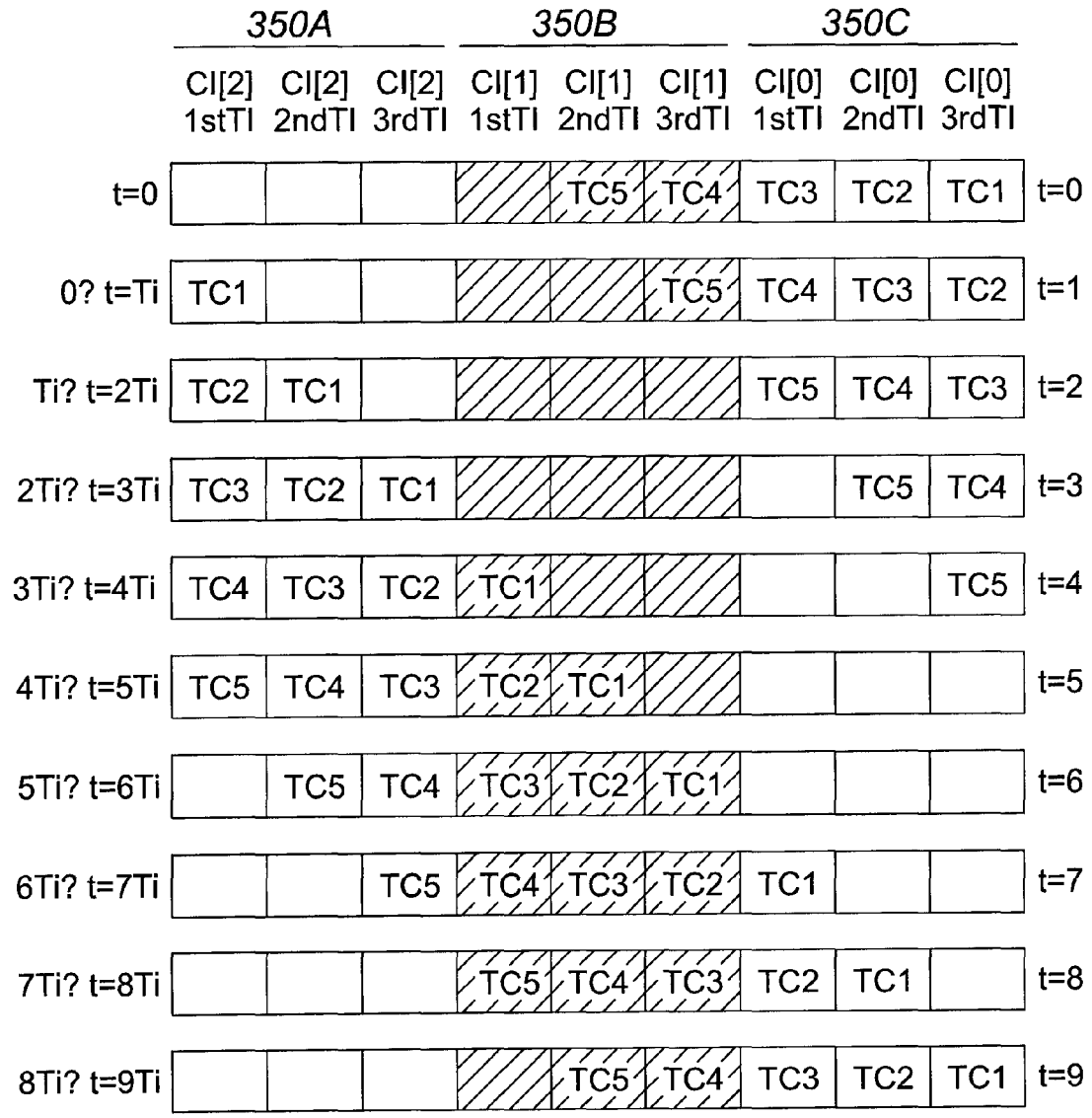
FIG. 8 illustrates, for the embodiment in FIG. 7, the predetermined sequence of which tap currents are sent to which integrating means at which time intervals.

This is further illustrated in FIG. 8 where the sequences for integrating means 350B and current at integrating means 350C are shown to be the same in sequence but with different phases for the repeating sequence.

FIG. 8 schematically depicts how the five tap currents in FIG. 7 are rotated among the three integrating means 350A, 350B, 350C. In this embodiment, each tap current is sent to an integrating means for three Ti intervals. In FIG. 8, the status and destination of each tap current is tracked across 10 time slots, from t=0 to t=9. The first time slot t=0 is a snapshot at t=0. Each remaining box represents the tap current received by an integrating means during an entire Ti time interval. Thus, at t=0, which is the end of a previous cycle, circuit 350A is not receiving any tap currents while 350B is receiving tap currents TC5 and TC4. Each integrating means has three Ti intervals: 1st Ti, 2nd Ti, and 3rd Ti. Thus, from FIG. 8, integrating means 350A has the 3 leftmost Ti intervals, integrating means 350B has the middle Ti intervals, and 350C has the last remaining Ti intervals. The time domain process of a tap current being sent to an integrating means for 3 Ti intervals is depicted in FIG. 8 as moving through three boxes of an integrating means. Once an intermediate tap current enters the 1st Ti slot for an integrating means, that current continues to be sent to that integrating means for a total of 3 Ti intervals.

For this embodiment, the integrating means also enters integrating and rest or sampling phases. Taking 350A as an example, it can be seen from the leftmost Ti intervals in FIG. 8 that 350A's integrating phase lasts from the time t=1 to t=7. For the time intervals t=8 and t=9, circuit 350A is in its rest/sampling phase as no tap currents are being sent to it. If we continue the process, at t=10 (not shown but equivalent to the t=1 row), circuit CI[2] would receive tap current TC1, thereby starting the circuit's next integrating phase. It can be shown that the received tap current falling within the three Ti intervals of 350A is, for time t=1 to t=7, RTC[1]=TC1;
RTC[2]=TC1+TC2;
RTC[3]=TC1+TC2+TC3;
RTC[4]=TC2+TC3+TC4;
RTC[5]=TC3+TC4+TC5;
RTC[6]=TC4+TC5;
RTC[7]=TC5;

Similarly, 350B is the integrating phase from t=4 to t=10. The circuit is in the rest phase during at t=11 and t=12 (again not shown in FIG. 8).

In this embodiment, the integrating phase has a duration of 7 Ti intervals while the rest phase has a duration of 2 Ti intervals. The sampling period (defined as the time interval between one circuit entering a specific phase and an adjacent circuit entering the same phase) is 3 Ti intervals. This can be seen by observing that circuit 350B enters its rest phase at t=2 while circuit 350A enters the same phase at t=5. In general, the sampling period is Nconv×Ti. The integrating phase has (Nt+Nconv−1)×Ti intervals with Nt being the number of coefficients being used in the generation of the tap currents. The number of Ti intervals in the rest phase is given by $$Nrest=Nconv(Ns-1)-Nt+1$$

where Ns is the number of integrating means.

This equation is used to determine Ns so that Nrest is sufficient to allow for operational amplifier settling and to allow time for sampling of the output signal and subsequent resetting of the integrating means.

Nt is predetermined by the desired filter response. Nconv=$f_i/f_s$ is predetermined by Ti and the required sampling frequency. Nrest is determined by the time it takes for the integrating means to move sufficient percentage of charges in the tap currents to the integrating capacitors. Once Nrest, Nconv, and Nt are known, Ns can be calculated using the above equation.

FIG. 9 shows the clock bus states to implement the above-described rotation of the intermediate tap currents. Each group of clock bus states corresponds to one of the intermediate tap generators. Each of the five clock buses has the same 9 states to cycle through: 3 [100] states, 3 [010] states and 3 [001] states. However, their initial states may be different. Any bus clock stays at one of the 9 clock bus states only for one Ti interval.

Clock generator 201 and switch matrix 202 provide the signals for the above-described tap current rotation. The clock generator provides 5 clock buses which control the switch matrix and which sends 5 tap currents TC1 to TC5 to 3 integrating means 350A, 350B, 350C as shown in FIG. 7. The five clock buses are denoted as CK1[2:0], CK2[2:0], CK3[2:0], CK4[2:0], CK5[2:0]. Here, CKi[2:0] controls switches for rotating TCi with i=1, 2, 3, 4, 5. Clock CKi[2:0], CKi[2], CKi[1] and CKi[0] control switches Si2, Si1 and Si0, respectively, again with i=1, 2, 3, 4, and 5. All the clock bus bits are active high, i.e., when CKi[j] is high, switch Sij is closed and TCi is sent to 350j, (i=1, 2, 3, 4, 5 and j=A, B, C).

As a variant of the embodiment illustrated in FIG. 7, a tap current can be thrown away (dumped to ground or virtual ground) for a number of Ti intervals. Doing so increases Nr (lengthens the rest period when the voltage in the integrating circuit may be sampled) it but also increases the sampling period (i.e., the sampling period will be longer than Nconv× Ti). Such a variant becomes useful where a larger Nr is required and a longer sampling period is acceptable. This way, Nr is made larger without increasing the number of integrating means, thereby increasing hardware efficiency.

For the above-noted variant, the tap current can be discarded in two slightly different ways. Both methods involve one or more grounds or virtual grounds being inserted between the integrating means. One requirement for this is that the number of grounds or virtual grounds between any two adjacent integrating means should be the same. Furthermore, since the first and the last integrating means can be seen as adjacent to one another in a ring configuration, there should be a similar number of grounds or virtual grounds between the last and the first integrating means.

For this variant, the integrating means and the grounds or virtual grounds in between the circuits together form an array of intermediate tap current destinations. To discard an intermediate tap current, the grounds or virtual grounds are treated the same way as the integrating means, i.e, an intermediate tap current will be sent to a ground or virtual ground for the same number of Ti intervals as if they the intermediate tap current was being sent to a integrating means. For this, the switch matrices and the controlling clock buses will be designed or generated the same way as if the array of the intermediate tap current destinations were all made up of integrating means. Alternatively, an intermediate tap current may be discarded for a different number of Ti intervals than the number of Ti intervals for which the current is sent to a integrating means. For this variant, the switch matrices are the same as if the array of the intermediate tap current destinations were all made up of integrating means. However, the clock buses used for controlling the switches will be different from the variant where there were no grounds or virtual grounds. Again, all the grounds or virtual grounds may be implemented physically as a single ground or virtual ground. Referring to FIG. 7, if we want to discard an intermediate tap current shown in this figure for one Ti interval every time it disconnects from a integrating means, one more switch S3i in the switch matrix 200 should be added for intermediate tap current TCi. The five clock buses will become 4 bits and the bus state rotation is given in FIG. 10. In this example, the sampling period is 4 Ti intervals.

It should be noted that there are a number of advantages with working with tap currents generated from convolving intermediate tap currents. First, compared with the embodiment where tap currents are discarded before being switched to the next integrating means, the embodiment which uses convolution does not waste or discard tap currents which helps to maintain a better SNR.

The second advantage arises only when there is quantization error in the intermediate set of tap coefficients. The process of tap or tap current convolution effectively increases the number of quantization levels using the same tap current cell. For example, suppose in the embodiment, the taps are quantized to the following values: −3, −2, −1, 0, 1, 2, 3. After convolving the tap currents with [1 1 1], the available values becomes −9, −8, −7, . . . , −1, 0, 1, . . . , 7, 8, 9. The number of quantization levels increase from 7 to 19 without changing the tap current cell.

Figure 11:
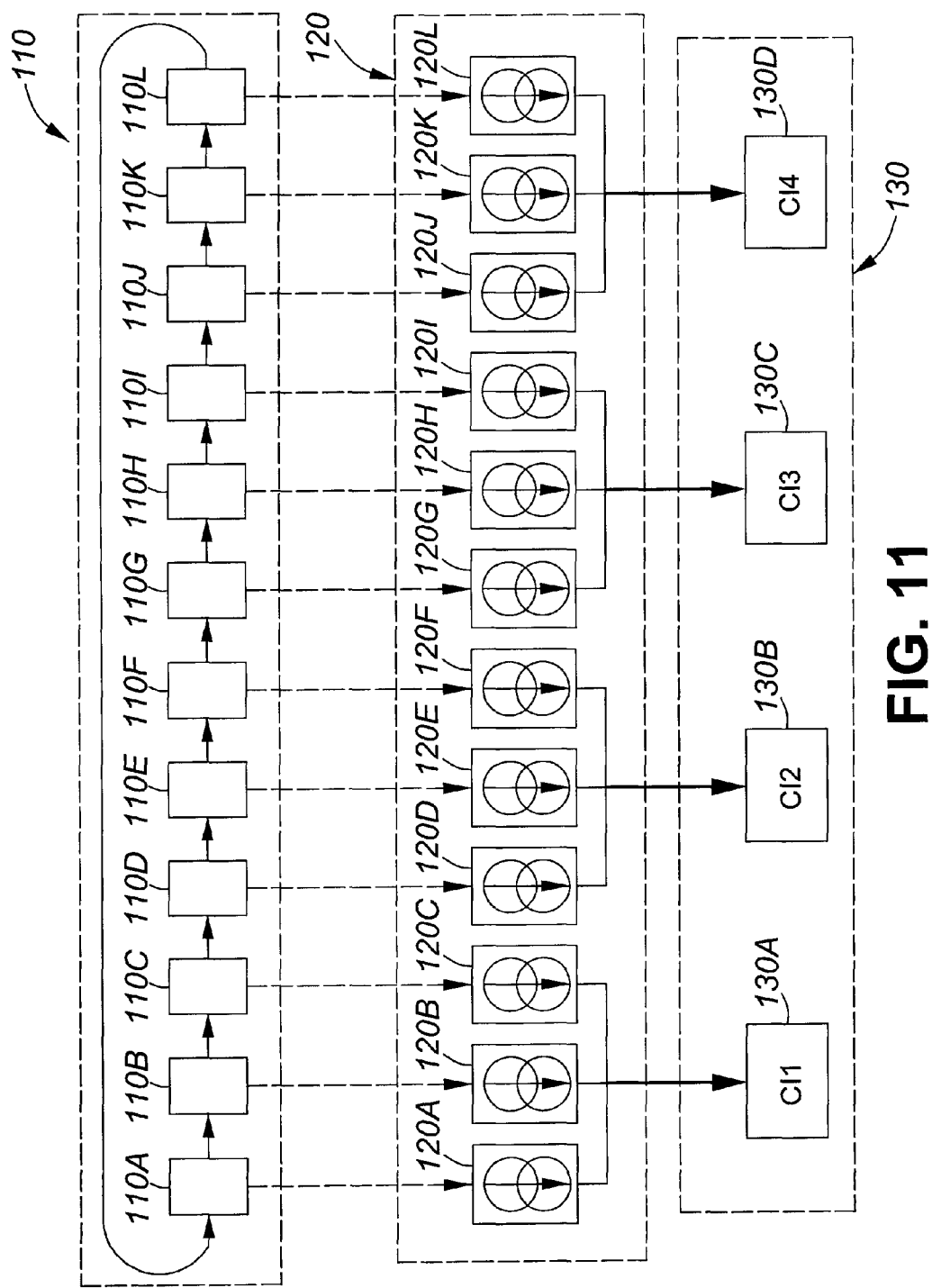
FIG. 11 is a schematic illustration of another embodiment of the invention where an intermediate set of tap coefficients generate tap currents that are convolved with a secondary set of tap coefficients where the filter is implemented by rotating the intermediate set of tap coefficients.

Referring to FIG. 11, an embodiment of the invention which rotates the intermediate taps currents by rotating the tap coefficients is illustrated. The system comprises a tap storage and rotating means 110, a tap current generating means 120 (made up of an array of tap current cells 120A, 120B, . . . 120L) and an array of integrating means and with a sampling and resetting means 130. The sampling and resetting means are not shown in the figure and are similar in structure and function to the sampling and resetting means 130 in FIG. 5.

In this embodiment, there are Ns=4 integrating means, each of which can be an integrating means similar in function and structure to integrating means 125A, 125B, . . . 125n in FIG. 5. Each CI is coupled to receive tap currents from 3 tap current cells. As an example, CI[1] is coupled to tap current cells 120A, 120B, 120C. Each tap current cell has one tap storage element associated with it. As an example, generator 120A is coupled to storage element 110A. Each tap current cell is configurable and its proportionality factor is controlled by the tap coefficient stored in its corresponding tap storage element.

The tap storage and rotating means 110 can be implemented similarly to that for the embodiment described by FIG. 5.

At any time, the tap coefficients occupy Nt contiguous storage elements with Nt being defined as the number of coefficients in the intermediate set of tap coefficients. Similarly, the padding zeros also occupy contiguous adjacent storage elements. Any two adjacent tap coefficients, a(i) and a(i+1) must be stored in two neighboring storage elements at any time with elements 110L and 110A being neighboring elements due to the ring configuration of the shift register. The tap coefficients and the padding zeros are rotated inside the circular shift register when a clock signal is applied to it. When all the tap coefficients have passed through three storage elements that correspond to the same integrating means, it will have received a current which is all the tap currents convolved with [1 1 1]. A valid sample will be available in each integrating means during its rest phase which is the received current for that integrating means integrated over one period of the rotation of the tap coefficients.

In this embodiment, Nconv=3. Also, the sampling period is 3 Ti intervals with Ti being the period of the shift register clock. If the number of coefficients in the intermediate set of tap coefficients is 5, then it takes 7 Ti for all the five coefficients to pass through any three storage elements that belong to the same CI. Since the number of Ti intervals in one complete rotation is 12 (i.e., the number of storage elements is 12), there are therefore 5 Ti intervals in a rest phase. In general, Nr=Nconv Ns−(Nt+Nconv−1), where Nconv Ns is the number of storage elements and N+Nconv−1 is the number of Ti intervals required for the intermediate tap coefficients to pass through any Nconv storage elements corresponding to the same CI. Ns, the number of required CI's can be determined in the same manner as disclosed above in the discussion regarding the embodiment in FIG. 7.

It should be noted that this embodiment is very similar to the embodiment illustrated in FIG. 5 and described above. The main difference between these two embodiments is in the manner that the current generators are organized. In the embodiment in FIG. 5, each current generator is coupled to a current integrator circuit and a storage element. In the embodiment in FIG. 11, each current generator is similarly coupled to a storage element but each current integrator circuit is coupled to, instead of one current generator, three current generators.

In this embodiment, every tap storage element has a tap current cell associated with it. In case longer rest phases are desired and where a longer sampling period is acceptable, a number of extra storage elements can be inserted between each two adjacent groups of storage elements with each group belonging to one CI. As an example, extra storage elements can be inserted between storage elements 110F and 110G, between storage elements 110I and 110J, and, finally, between storage elements 110A and 110L. The number of extra storage elements is denoted as Npr. In general, the total number of inserted storage elements is equal to Npr×Ns. In the above embodiment, Ns=4, so if we want to insert one storage element between each two adjacent groups, then we need 4 storage elements. In this case, the sampling period becomes 4 Ti intervals in duration and the rest phase increases from 5 Ti intervals to 9 Ti intervals in duration.

To optimize the circuit design for the embodiment which rotates tap currents for convolution, the different tap currents can be groups into groupings which will be referred to as phases. This will reduce the required circuitry as, instead of having to generate a clock bus for each and every tap current, the approach will allow one to merely generate the clock bus for the first tap current and to use different versions of this clock bus for the other tap currents. As an example, if the system had tap currents TC1 . . . TCn, we could generate the clock bus for tap current TC1 and we could then use the other values of that clock bus as the clock bus for the other tap currents TC2 . . . TCn.

In FIG. 7, clock generator 201 provides 5 clock buses CK1[2:0], to CK5[2:0] for controlling the 15 switches coupled between the tap currents and the integrating means, respectively. Specifically, CK1[2], CK1[1] and CK1[0] control S12, S11, and S10, respectively. Similarly, the other switches are controlled by corresponding clocks and a switch is closed when its corresponding clock bus bit is active as in the embodiment of FIG. 1. As in FIG. 1, the number of buses is set by the number of tap current cells and the number of bits in each bus is set by the number of integrating means.

FIG. 9 shows a summary of the required clock buses. Each Ti, the clock buses advance by one state corresponding to moving down one line in the table. From the table, it can be seen that CK4[0] is equivalent to CK1[2] and as a result there is no need to independently generate CK4[2]. Similarly CK1[1:0] and CK5[2:0] can be provided by signals in CK2[2:0].

Figure 12:
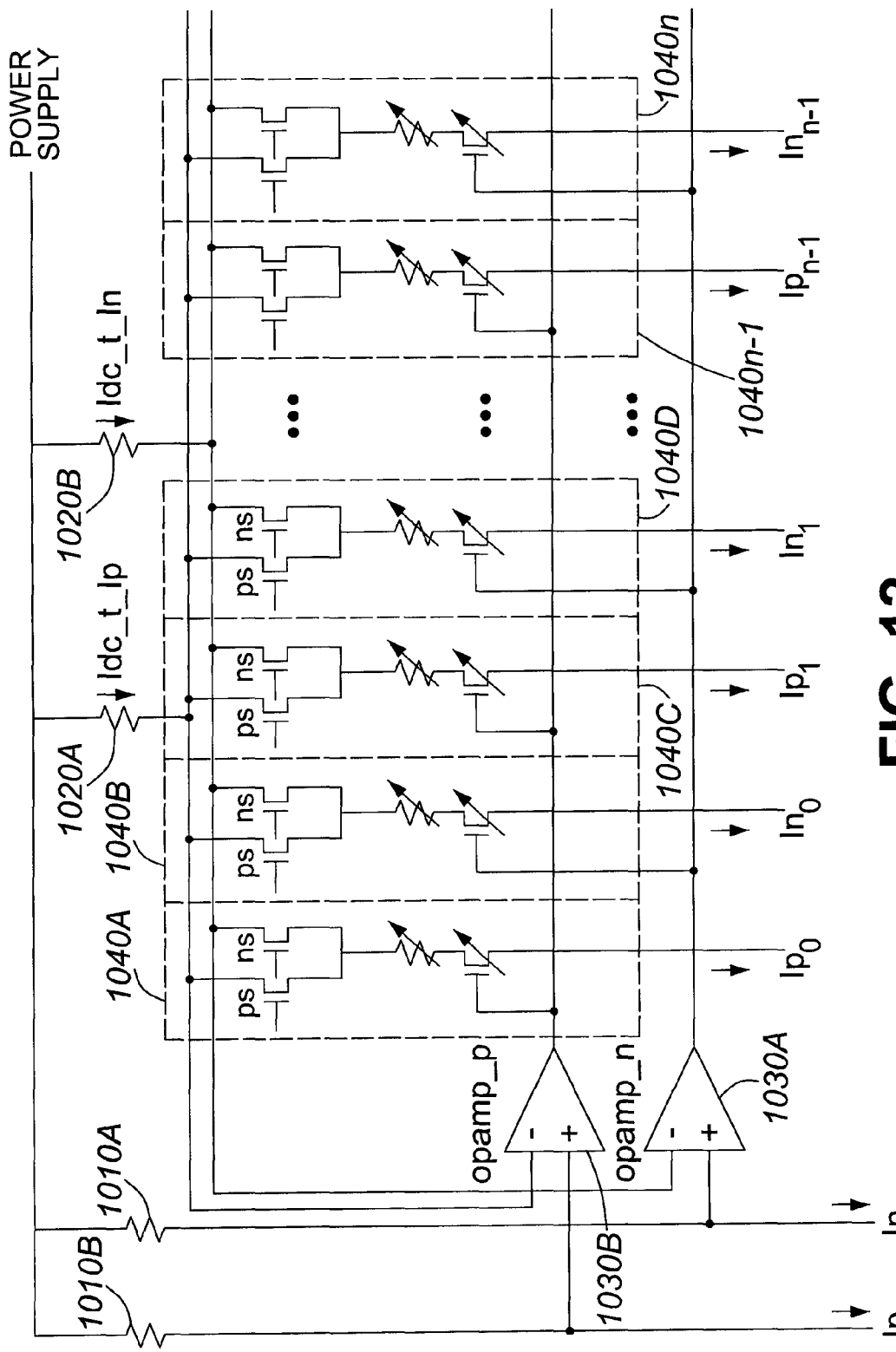
FIG. 12 schematically illustrates circuits and methods for providing tap currents for use with the invention by current splitting.

FIG. 12 shows a schematic illustration of a tap current generation circuit which supports very simple tap current cells that may be used with the invention. This teaches how tap current cells can provide currents proportional to an input signal by splitting a mirrored current. In the figure, the inputs to the circuit are the differential current inputs Ip and In (p stands for positive and n for negative), where Ip=Idc+ip and In=Idc+in and the two current inputs comprise the input signal. There are two set of output currents: the positive set of tap currents Ip0, Ip1, . . . . Ipn−1 and the negative set of tap currents In0, In1, . . . i 1. Each of the positive and negative halves of the circuit forms half a current mirror and each of which is implemented by two resistors 1010A, 1010B, 1020A, 1020B, one operational amplifier 1030A, 1030B and a set of tap current generating or tap current splitting cells 1040A, 1040B, 1040C, 1040D, . . . 1040n−1, 1040n.

Figure 13:
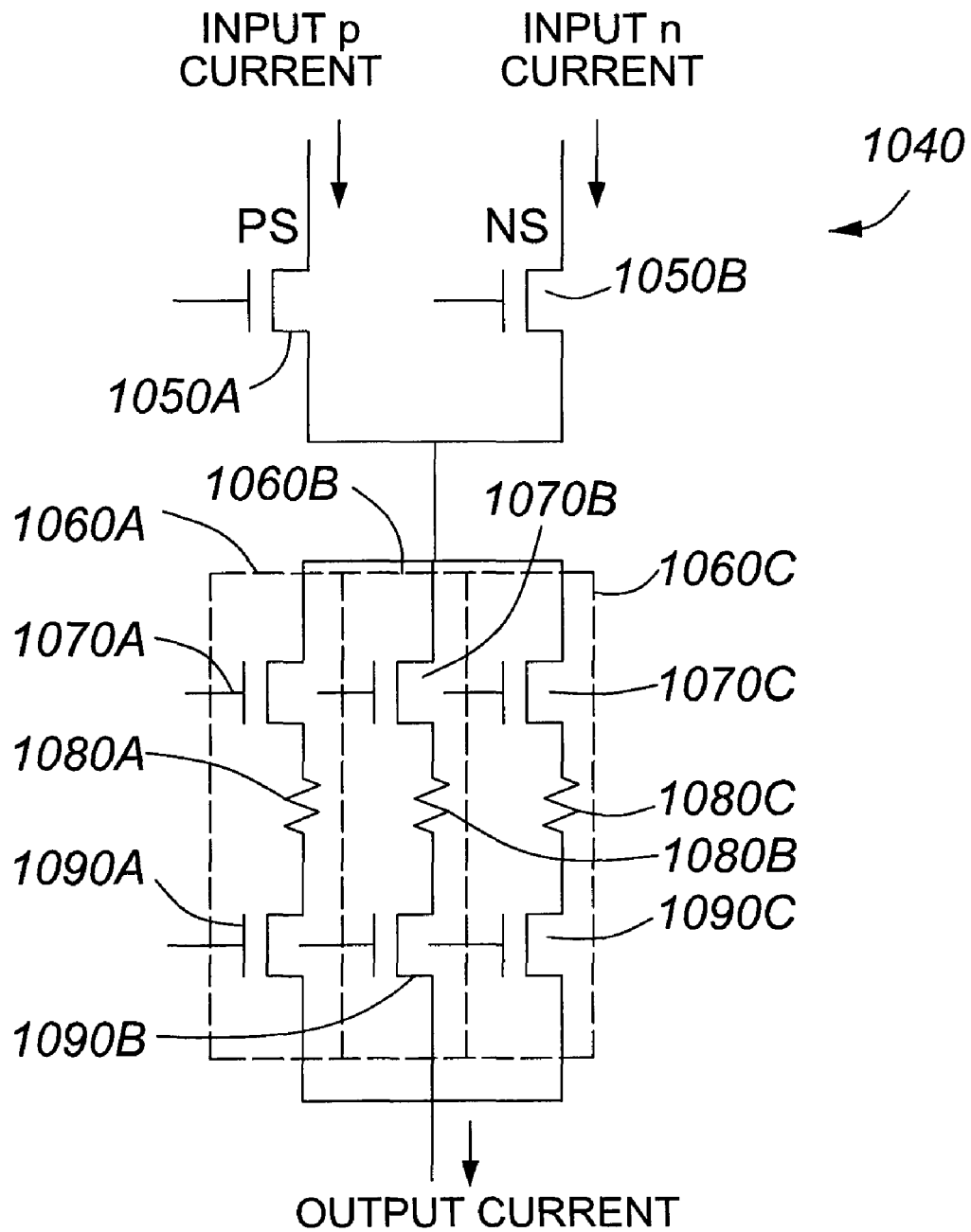
FIG. 13 schematically illustrates a tap current cell used to provide the tap currents of FIG. 15.

FIG. 13 schematically illustrates the details for a tap current cell 1040 which may be used in the tap current generating circuit of FIG. 12. The tap current cell 1040 is made up of two switches: the positive switch PS and a negative switch NS, both of which are implemented as PMOS transistors 1050A 1050B. For this circuit, the tap current cell has three current generating units 1060A, 1060B, 1060C controlled by three switching transistors. Each current generating unit is made up of one switch transistor (1070A, 1070B, 1070C), a degeneration resistor (1080A, 1080B, 1080C) and a current transistor (1090A, 1090B, 1090C). A current unit can be turned on or off by turning on or off the switch transistor (1070A, 1070B, 1070C). Each current generating cell is programmed by its corresponding tap coefficient. The sign of the tap coefficients are used to control switches PS and NS. In this circuit, when the tap coefficient is a positive number, PS is closed and NS is open. Otherwise, PS is open and NS is closed. That is, for a positive tap coefficient, the positive input is selected and for a negative coefficient the negative input is selected—this controls the sign of a tap current. The amplitude of the tap current is controlled by the magnitude of the tap coefficient. Specifically, the number of current units that are turned on is equal to the absolute value of the tap coefficient. For example, when the absolute value of the tap coefficient is 2, then there are two units that are turned on. When the absolute value of the tap coefficient is 0, then all three switch transistors (and hence all three units) are turned off. Since a tap current cell has three current units, the magnitude of its output ranges from 0 to 3. This means that a tap current cell using this circuit can generate a tap current ranging from −3 to 3. It should be noted that other variants which have multiple current units can also be used.

Figure 14:
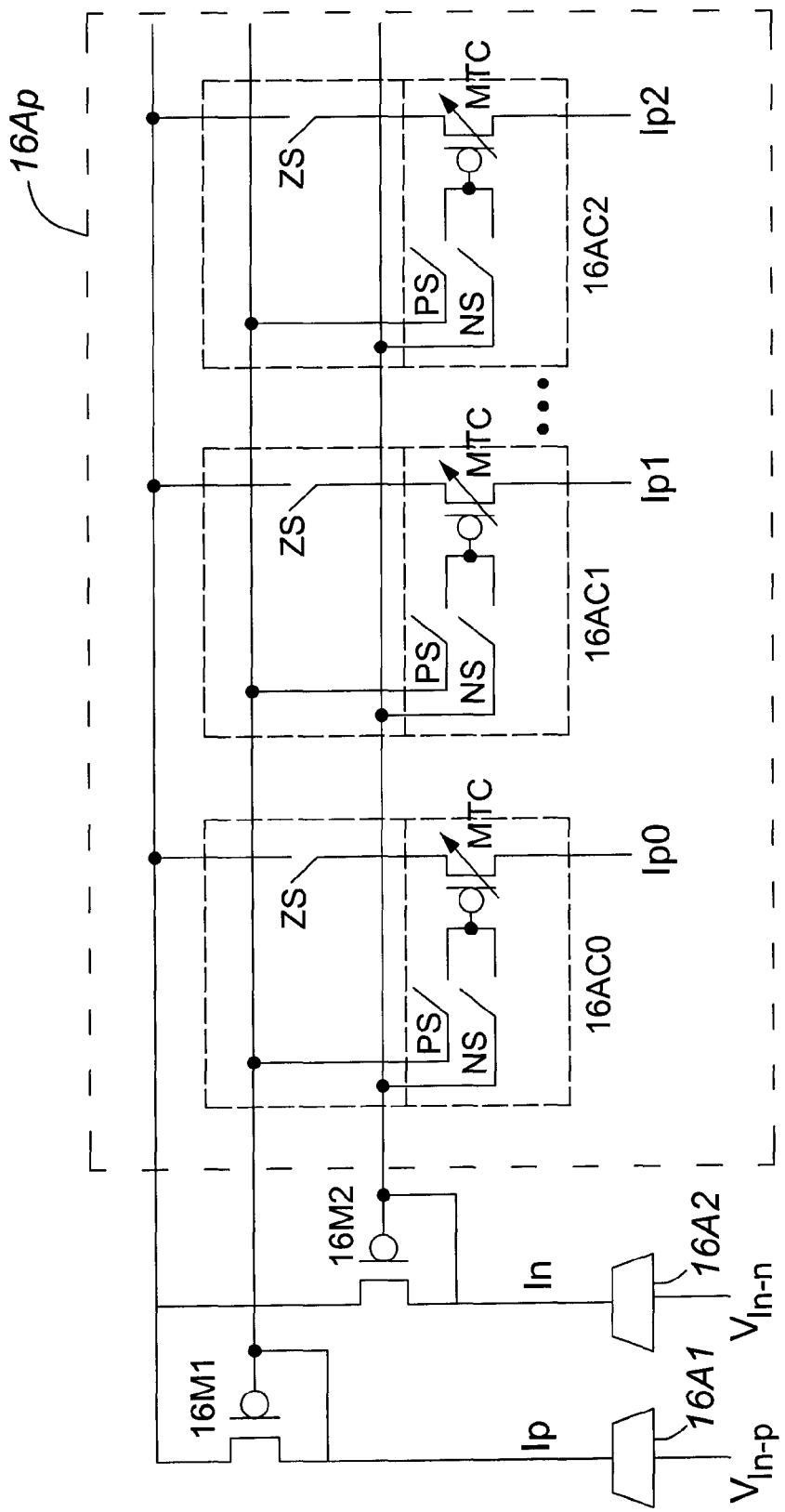
FIG. 14 schematically illustrates circuits and methods for providing tap currents for use with the invention by current replication.

Referring to FIG. 14, another tap current generation circuit which supports even simpler tap current cells in an all CMOS process that may be used with the invention tap current cell circuit is illustrated. This teaches how tap current cells can provide currents proportional to an input signal by replicating a current. In this example, the replication is done with a current mirror. In the figure, the inputs to the circuit are the differential voltage inputs Vin-p and Vin-n (p stands for positive and n for negative), where Ip and In are generated along with a dc bias using transconductance elements 16A1 and 16A2. There are two set of output currents: the positive set of tap currents Ip0, Ip1, and Ip2 and the negative set of tap currents In0, In1, and In2. Each of the positive and negative halves of the circuit forms half of a differential current mirror. In the positive half of the output of the current mirror 16Ap, three tap current cells 16AC0 16AC1 and 16AC2 are shown. Each of these tap current cells reflects either the positive or negative input according to the sign of the desired tap coefficient by selectively closing the PS or NS switch. For a positive tap coefficient, PS is closed and the positive input current is reflected in the mirrored output by coupling to transistor 16M1. For a negative tap coefficient, NS is closed and the negative input is reflected in the mirrored output by coupling to transistor 16M2. A tap coefficient of zero can be implemented in each tap current cell by closing a ZS switch.

The negative set of outputs are generated by a negative half of the output current mirror identical to the positive half except that in each cell, the PS and NS switches are coupled differently. In each cell the PS switch, which closes for a positive tap coefficient, couples the gate of MTC to 16M2 and the NS switch couples the gate of MTC to 16M1.

Figure 15:
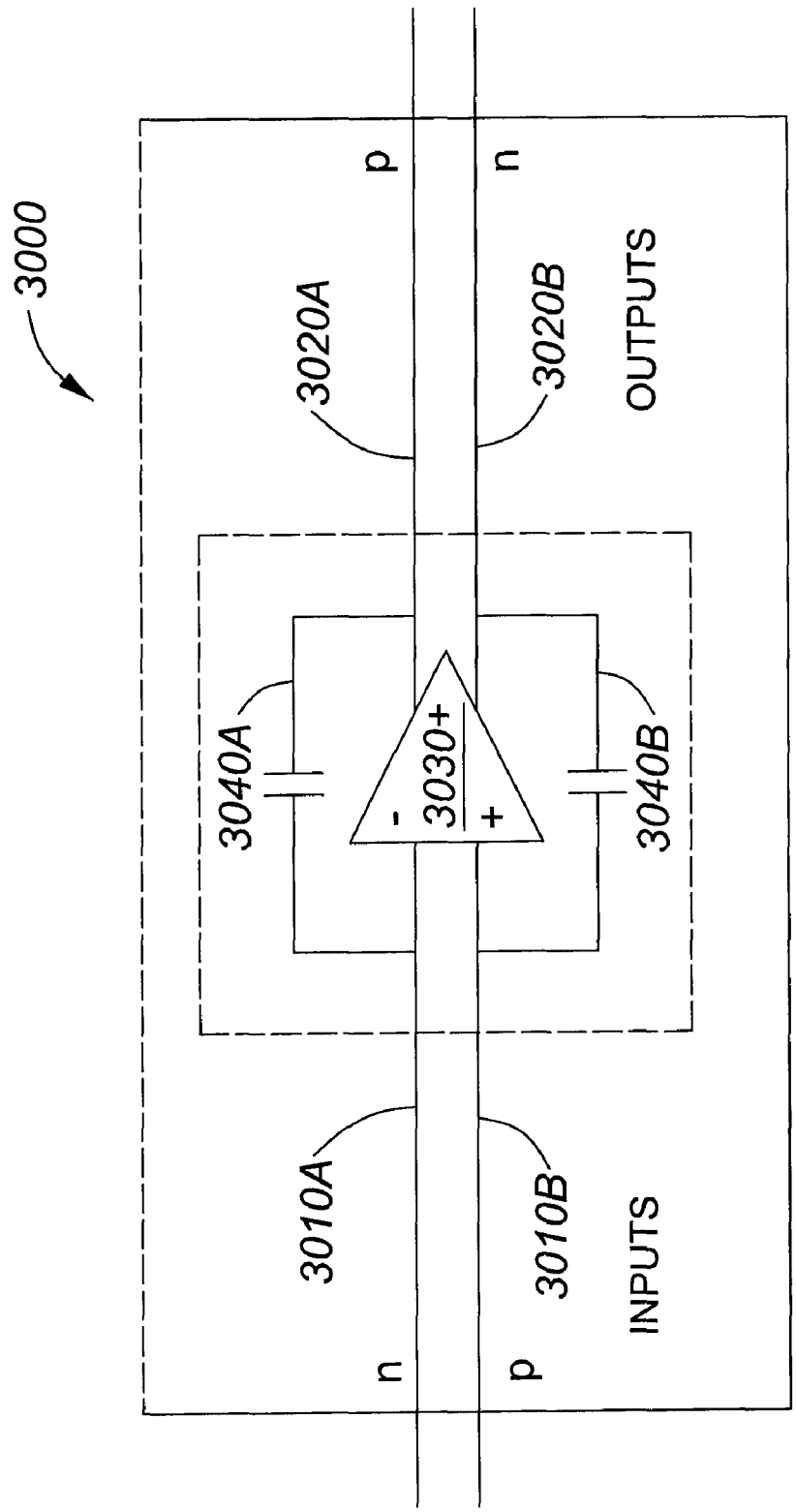
FIG. 15 schematically illustrates an integrating means which may be used with the invention.

Referring to FIG. 15, a schematic illustration of a integrating means which may be used with the invention is illustrated. As can be seen from the figure, the integrating means 3000 has two inputs 3010A, 3010B and two outputs 3020A, 3020B. The circuit 3000 comprises an operational amplifier 3030 with capacitors 3040A, 3040B coupled between each pair of inputs and outputs. When used to integrate differential tap currents, the positive currents are coupled to the p input of the operational amplifier 3030 while the negative currents are coupled to the n input.

Although various exemplary embodiments of the invention have been disclosed, it should be apparent to those skilled in the art that various changes and modifications can be made which will achieve some of the advantages of the invention without departing from the true scope of the invention.

A person understanding this invention may now conceive of alternative structures and embodiments or variations of the above all of which are intended to fall within the scope of the invention as defined in the claims that follow.

Having thus described the invention, what is claimed as new and secured by Letters Patent is:

1. A filter for filtering and sampling an input signal, the filter comprising:
   a plurality of tap current cells each tap current cell being for producing at least one tap current from said input signal;
   a plurality of current integrating cells, each current integrating cell being for receiving and integrating tap currents from said tap current cells;
   current sampling means for sampling and resetting charges in said current integrating cells, said current sampling means being coupled to said current integrating cells:
   current distribution means for coupling said tap current cells with said current integrating cells;
   wherein each current integrating cell comprises an operational amplifier and a capacitor coupled between an output of said operational amplifier and a negative input of said operational amplifier and
   wherein said current distribution means is controlled by at least one first clock signal and said current sampling means is controlled by at least one second clock signal.

2. A filter according to claim 1 wherein said current distribution means is a network of switches, said network of switches coupling at least one of said tap current cells with at least one of said current integrating cells when specific switches of said network of switches are closed, said switches being opened and closed according to a predetermined pattern based on said first clock signal.

3. A filter according to claim 1 wherein said current distribution means comprises a network of conductors, each conductor coupling one of said plurality of tap current cells with at least one of said plurality of current integrating cells, said current distribution means further comprising a shift register having a plurality of elements arranged in a ring configuration said elements being for storing a plurality of coefficients, said plurality of coefficients being for determining which tap current is active, a plurality of said elements being coupled to tap current cells such that said plurality of coefficients stored in said coupled elements are applied to said tap current cells.

4. A filter according to claim 1 wherein said current sampling means is a network of sampling switches and a sampler, a closing of specific sampling switches coupling said sampler with a specific one of said current integrating cells, said sampling switches being opened and closed according to a predetermine pattern based on said second clock signal.

5. A filter according to claim 1 wherein said sampling means further comprises a plurality of resetting switches coupled to said current integrating cell, each resetting switch being coupled to a corresponding current integrating cell such that closing said resetting switch resets said current integrating cell.

6. A filter according to claim 3 wherein said plurality of coefficients stored in said elements is shifted in said register according to a predetermined pattern.

7. A filter according to claim 1 wherein at least one of said current integrating cells is replaced by at least one ground.

8. A filter according to claim 3 wherein at least one padding element is uncoupled to a tap current cell, said padding element being part of said shift register.

9. A filter according to claim 1 wherein during an integrating phase of said filter, at most only one tap current at a time is coupled to each current integrating cell.

10. A filter according to claim 1 wherein during an integrating phase of said filter, multiple tap currents are simultaneously coupled to at least one current integrating cell.

11. A method for filtering a signal, the method being for use with a device having a plurality of integrating means, the method comprising:
   a) receiving said signal;
   b) generating a plurality of tap currents based on said signal;
   c) coupling each of said plurality of tap currents to a specific one of said plurality of integrating means in a predetermined sequence during an integrating phase for said specific one of said plurality of integrating means;
   d) sampling a current in said specific one of said plurality of integrating means during a sampling phase for said specific one of said plurality of integrating means;
   e) repeating steps c) and d) for each of said plurality of integrating means
   wherein each integrating means comprises an operational amplifier and a capacitor coupled between an output of said operational amplifier and a negative input of said operational amplifier and
   wherein said sampling phase is a phase when none of said tap currents are being sent to said specific one of said plurality of integrating means.

12. A method according to claim 11 wherein during said integrating phase for said specific one of said plurality of integrating means, only one tap current at a time is sent to said specific integrating means.

13. A method according to claim 11 wherein during said integrating phase, multiple ones of said plurality of tap currents are simultaneously being coupled to said specific integrating means.

14. A method according to claim 12 wherein step c) is accomplished by closing switches which couple a specific tap current means with said specific current integration means.

15. A method according to claim 13 wherein step c) is accomplished by closing switches which couple a specific tap current means with said specific current integration means.

16. A method according to claim 12 wherein step c) is accomplished by applying a coefficient to a tap current generating means coupled to a integrating means.

17. A method according to claim 11 wherein for each integrating means, said sampling phase is entered only after said current sampling means has received all of said tap currents.

18. A method according to claim 13 wherein step c) is accomplished by applying a coefficient to a tap current generating means coupled to a integrating means.

19. A method for filtering a signal, the method being for use with a device having a plurality of integrating means, the method comprising:
   a) receiving said signal;
   b) generating a plurality of tap currents based on said signal;
   c) coupling each of said plurality of tap currents to a specific one of said plurality of integrating means in a predetermined sequence during an integrating phase for said specific one of said plurality of integrating means;
   d) sampling a current in said specific one of said plurality of integrating means during a sampling phase for said specific one of said plurality of integrating means;
   e) repeating steps c) and d) for each of said plurality of integrating means
   wherein
   wherein each of said plurality of integrating means comprises an operational amplifier and a capacitor coupled between an output of said operational amplifier and a negative input of said operational amplifier and
   said sampling phase is a phase when none of said tap currents are being sent to said specific one of said plurality of integrating means and
   wherein
   multiple tap currents are simultaneously coupled to at least one of said plurality of integrating means during said integrating phase.

* * * * *